US006682871B2

(12) United States Patent
Zhang

(10) Patent No.: US 6,682,871 B2
(45) Date of Patent: Jan. 27, 2004

(54) MICROELECTROMECHANICAL OPTICAL SWITCH AND METHOD OF MANUFACTURE THEREOF

(75) Inventor: Nan Zhang, Eden Prairie, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/789,887

(22) Filed: Feb. 21, 2001

(65) Prior Publication Data

US 2001/0008457 A1 Jul. 19, 2001

Related U.S. Application Data

(62) Division of application No. 09/372,265, filed on Aug. 11, 1999, now Pat. No. 6,229,640.

(51) Int. Cl.$^7$ .............. G03F 7/00; H01L 21/00; H02N 1/00
(52) U.S. Cl. .......... 430/311; 430/321; 430/322; 430/323; 385/16; 385/18
(58) Field of Search .............. 430/321, 322, 430/323, 324, 325; 385/16, 18; 216/2, 24; 359/117

(56) References Cited

U.S. PATENT DOCUMENTS

| | | | |
|---|---|---|---|
| 4,269,648 A | 5/1981 | Dakss et al. | 156/293 |
| 5,018,812 A | 5/1991 | Fukuda | 350/96.14 |
| 5,110,760 A | 5/1992 | Hsu | 437/180 |
| 5,148,506 A | 9/1992 | McDonald | 385/16 |
| 5,155,778 A | 10/1992 | Magel et al. | 385/18 |
| 5,199,088 A | 3/1993 | Magel | 385/18 |
| 5,232,866 A | 8/1993 | Beyer et al. | 437/62 |
| 5,239,599 A | 8/1993 | Harman | 385/16 |

(List continued on next page.)

FOREIGN PATENT DOCUMENTS

| | | |
|---|---|---|
| DE | 42 21 918 A1 | 1/1994 |
| EP | 0 647 966 A1 | 4/1995 |
| JP | 53-84738 | 7/1978 |
| JP | 1-224709 | 9/1989 |
| WO | WO 98/12589 | 3/1998 |
| WO | WO 99/36948 | 7/1999 |
| WO | WO 99/50863 | 10/1999 |

OTHER PUBLICATIONS

E.Cullman and co–workers:" Advanced Resist Processing for thick photoresist applications"; Microelectronic Engineering, v30, 1996, p. 551–554.*
W.W.Flack and co–workers: "Characterization of Ultra–thick Photoresists for MEMS Applications using a 1X Stepper", SPIE,v3512,(1998), p 926–314.*
Article entitled "Verticle Mirrors Fabricated by Reactive Ion Etching for Fiber Optical Switching Applications" by Marxer et al., 6 pages.
Article entitled "Microactuated Micro–XYZ Stages for Free–Space Micro–Optical Bench" by Lin et al., 6 pages.

(List continued on next page.)

Primary Examiner—Mark F. Huff
Assistant Examiner—K Sagar
(74) Attorney, Agent, or Firm—Merchant & Gould P.C.

(57) ABSTRACT

A MEMS-based optical switch having improved characteristics and methods for manufacturing the same are provided. In accordance with one embodiment, an optical switch includes a single comb drive actuator having a deflecting beam structure and a mirror coupled to the actuator. The mirror is capable of being moved between an extended position interposed between waveguide channels and a retracted position apart from the waveguide channels. The actuator applies a force capable of deflecting the beam structure and moving the mirror to one of the extended positions or the retracted position and the beam structure returns the mirror to the other of the extended position or the retracted position in the absence of the application of force.

11 Claims, 8 Drawing Sheets

U.S. PATENT DOCUMENTS

| | | | | |
|---|---|---|---|---|
| 5,290,400 | A | 3/1994 | Bobbio | 156/655 |
| 5,345,521 | A | 9/1994 | McDonald et al. | 385/16 |
| 5,375,033 | A | 12/1994 | MacDonald | 361/281 |
| 5,393,375 | A | 2/1995 | MacDonald et al. | 156/643 |
| 5,403,673 | A | 4/1995 | Haga et al. | 428/688 |
| 5,420,067 | A | 5/1995 | Hsu | 437/180 |
| 5,426,070 | A * | 6/1995 | Shaw et al. | 257/734 |
| 5,576,147 | A | 11/1996 | Guckel et al. | 430/313 |
| 5,578,975 | A | 11/1996 | Kazama et al. | 333/202 |
| 5,594,818 | A | 1/1997 | Murphy | 385/8 |
| 5,594,820 | A | 1/1997 | Garel-Jones et al. | 385/22 |
| 5,616,514 | A | 4/1997 | Muchow et al. | 438/50 |
| 5,618,383 | A | 4/1997 | Randall | 430/314 |
| 5,623,564 | A | 4/1997 | Presby | 385/20 |
| 5,623,568 | A | 4/1997 | Khan et al. | 385/16 |
| 5,627,924 | A | 5/1997 | Jin et al. | 385/22 |
| 5,628,917 | A * | 5/1997 | MacDonald et al. | 216/2 |
| 5,629,993 | A | 5/1997 | Smiley | 385/22 |
| 5,661,591 | A | 8/1997 | Lin et al. | 359/290 |
| 5,684,631 | A | 11/1997 | Greywall | 359/565 |
| 5,706,123 | A | 1/1998 | Miller et al. | 359/291 |
| 5,719,073 | A | 2/1998 | Shaw et al. | 437/228 |
| 5,750,420 | A | 5/1998 | Bono et al. | 438/52 |
| 5,761,350 | A | 6/1998 | Koh | 385/14 |
| 5,774,604 | A | 6/1998 | McDonald | 385/18 |
| 5,778,513 | A | 7/1998 | Miu et al. | 29/602.1 |
| 5,790,720 | A | 8/1998 | Marcuse et al. | 385/7 |
| 5,808,780 | A | 9/1998 | McDonald | 359/290 |
| 5,814,554 | A | 9/1998 | De Samber et al. | 438/611 |
| 5,858,622 | A | 1/1999 | Gearhart | 430/315 |
| 5,863,839 | A | 1/1999 | Olson et al. | 438/695 |
| 5,871,383 | A | 2/1999 | Levine et al. | 445/52 |
| 5,949,125 | A | 9/1999 | Meyer | 257/510 |
| 5,985,524 | A | 11/1999 | Allen et al. | 430/326 |
| 5,998,906 | A * | 12/1999 | Jerman et al. | 310/309 |
| 6,045,864 | A * | 4/2000 | Lyons et al. | 427/255.23 |
| 6,108,466 | A | 8/2000 | Aksyuk et al. | 385/19 |
| 6,175,170 | B1 * | 1/2001 | Kota et al. | 310/307 |
| 6,180,536 | B1 * | 1/2001 | Chong et al. | 385/19 |

OTHER PUBLICATIONS

Document entitled "Folded Beam Structures in Polysilicon Resonators" printed from internet site www.aad.Berkeley.edu, Jan. 25, 1999, 3 pages.

Document entitled "Total MEMS Solutions™, Advanced MicroMachines Incorporated" printed from internet site www.memslink.com, Apr. 26, 1999, 2 pages.

Document entitled "Mems Optical Inc. Micro–Electro–Mechanical Systems" printed from internet site www.memsoptical.com, Oct. 8, 1998, 6 pages.

Document entitled "UW–MEMS Patent Archive" printed from internet site www.mems.engr.wisc.edu, Oct. 8, 1998, 3 pages.

Document entitled "MEMS Fabrication Capabilities in various institutions and organizations" printed from internet site www.mems.isi.edu, Oct. 8, 1998, 5 pages.

Document entitled "Intelligent Cross–Bar Switch for Optical Telecommunications based on Micro–Mirror Array" printed from internet site www.eptl.ch, Oct. 8, 1998, 7 pages.

Document entitled "Sandia National Laboratories Intelligent Micromachine Initiative, MEMS Overview" printed from internet site www.mdl.sandia.gov, Oct. 8, 1998, 7 pages.

Document entitled "Sandia National Laboratories Intelligent Micromachine Initiative Image Gallery" printed from internet site www.mdl.sandia.gov, Oct. 8, 1998, 8 pages.

Document entitled "Sandia National Laboratories Intelligent Micromachine Initiative Technologies: Integrated Trench Technology" printed from internet site www.mdl.sandia.gov, Oct. 8, 1998, 3 pages.

Document entitled "MEMS (Micro–Electro–Mechanical–System) Project" printed from internet site www.mcc.com, Oct. 8, 1998, 4 pages.

Document entitled "What is MEMS?" printed from internet site www.elvisions.com, Oct. 8, 1998, 1 page.

Document entitled "Statement of Work (Exhibit P) MEMS Project to the Research and Development Agreement Sep. 2, 1998" printed from internet site www.mcc.com, Oct. 8, 1998, 8 pages.

Document entitled "Introduction to Microengineering" printed from internet site www.ee.surrey.ac.uk, Oct. 8, 1998, 13 pages.

Hunziker, W. et al., "Elliptically Lensed Polarisation Maintaining Fibres",*Electronics Letters,* vol. 28, No. 17, pp. 1654–1656 (Aug. 13, 1992).

Juan, W.–H. et al., "High–Aspect Ratio Si Vertical Micromirror Arrays for Optical Switching",*J. Microelectromechanical Systems,* vol. 7, No. 2, pp. 207–212 (Jun. 1998).

Marxer, C. et al., "Vertical Mirrors Fabricated by Deep Reactive Ion Etching for Fiber–Optic Switching Applications",*J. Microelectromechanical Systems,* vol. 6, No. 3, pp. 277–284 (Sep. 1997).

Syms, R.R.A. et al., "Bulk micromachined silicon comb–drive electrostatic actuators with diode isolation", *Sensors and Actuators,* vol. 63, pp. 61–67 (1997).

* cited by examiner

MICROELECTROMECHANICAL OPTICAL SWITCH AND METHOD OF MANUFACTURE THEREOF

This application is a divisional of application Ser. No. 09/372,265, filed Aug. 11, 1999, which application is incorporated herein by reference U.S. Pat. No. 6,229,640.

BACKGROUND OF THE INVENTION

The present invention relates generally to optical switches and, more particularly, to microelectromechanical optical switches and methods of manufacturing such optical switches.

BACKGROUND OF THE INVENTION

Relatively modern technology now enables microelectromechanical systems (MEMS) to be fabricated on semiconductor substrates, typically silicon substrates. These microelectromechanical systems typically have sizes on the order of microns and may be integrated with other electrical circuits on a common substrate. As a result, microelectromechanical systems have found their way into numerous applications across numerous disciplines. Illustrative MEMS applications include optical switching, inertial or pressure sensors, and biomedical devices, for example.

MEMS-based optical switches are used in a variety of applications for switching light waves between optical waveguides, such as fibers. Present MEMS-based optical switches can operate in the plane of the substrate or normal to the substrate. An example of an in-plane optical switch using a vertical mirror is disclosed in C. Marxer et al., "Vertical Mirrors Fabricated By Reactive Ion Etching For Fiber Optical Switching Applications," Proceedings IEEE, The Tenth Annual International Workshop on Micro Electo Mechanical Systems, An Investigation of Micro Structures, Sensors, Acuators, Machines and Robots (Cat. No. 97CH46021), IEEE 1997, pp. 49–54. The Marxer optical switch includes a metal coated silicon mirror coupled to a dual comb drive actuator. The two comb actuators work in opposite directions to push the mirror into an optical path between optical fibers and to pull the mirror out of the optical path. The Marxer optical switch is fabricated in a single step using inductively coupled plasma etching technology with a sidewall passivation technique.

The Marxer switch is associated with a number of limitations. For example, its dual comb actuator requires power in both an extended position and a retracted position. Without power, the mirror undesirably lies midway between the fibers. In addition, while the Marxer fabrication technique provides walls with a verticality of 89.3° and surface roughness of 36 nanometers (nm) rms (root means squared), room for improving each of these characteristics exists. Conventional DRIE and photolithography techniques, relying on oxide masks and ultrasonic mask removal, also have deleterious effects on MEMS structures. For instance, these photolithography techniques often leave debris between structures. Accordingly, improvements in optical switches are desired.

SUMMARY OF THE INVENTION

The present invention generally provides a MEMS-based optical switch having improved characteristics and methods for manufacturing the same. In accordance with one embodiment of the invention, an optical switch is provided which includes a single comb drive actuator including a stationary comb mounted on a substrate, a movable comb interleaved with the stationary comb, and a beam structure connected between the substrate and the movable comb and a mirror coupled to the actuator. The optical switch further includes a pair of first waveguide channels and a pair of second waveguide channels disposed on the substrate. The mirror is capable of being moved between an extended position interposed between the waveguide channels and a retracted position apart from the waveguide channels. The two combs apply a force capable of deflecting the beam structure and moving the mirror to one of the extended positions or the retracted position and the beam structure returns the mirror to the other of the extended position or the retracted position in the absence of the application of force between the two combs.

In accordance with another embodiment of the invention, a method forming a mirror on a substrate is provided. The method includes forming, over the substrate, a patterned masking layer covering the first region of the substrate and two side regions of the substrate each adjacent a side of the first region. After forming the patterned masking layer, uncovered portions of the substrate are removed using the pattern masking layer to form a first raised structure in the first substrate region and a sacrificial raised structure in each side substrate region adjacent the first raised structure. The sacrificial raised structures are then selectively removed while leaving the first raised structure intact and a reflective surface is formed on the first raised structure.

In accordance with another embodiment of the invention, a method of forming combs for a comb drive actuator on a substrate is provided. This method includes forming multiple layers of the same photoresist material over the substrate to form a composite photoresist layer. The photoresist material may, for example, be photoresist S1818. After forming the composite photoresist layer, the composite layer is patterned and developed to form a patterned photoresist layer having an interleaved masking pattern. Using the interleave masking pattern, portions of the substrate are removed to form interleaved combs. The process of forming the multiple layers may, for example, include depositing each layer of the photoresist material and heating the layers after deposition. The use of a multiple layer of a photoresist material, such as S1818, can, for example, enhance the surface roughness and cleanliness of the resultant structure as compared to other types of masking layers.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
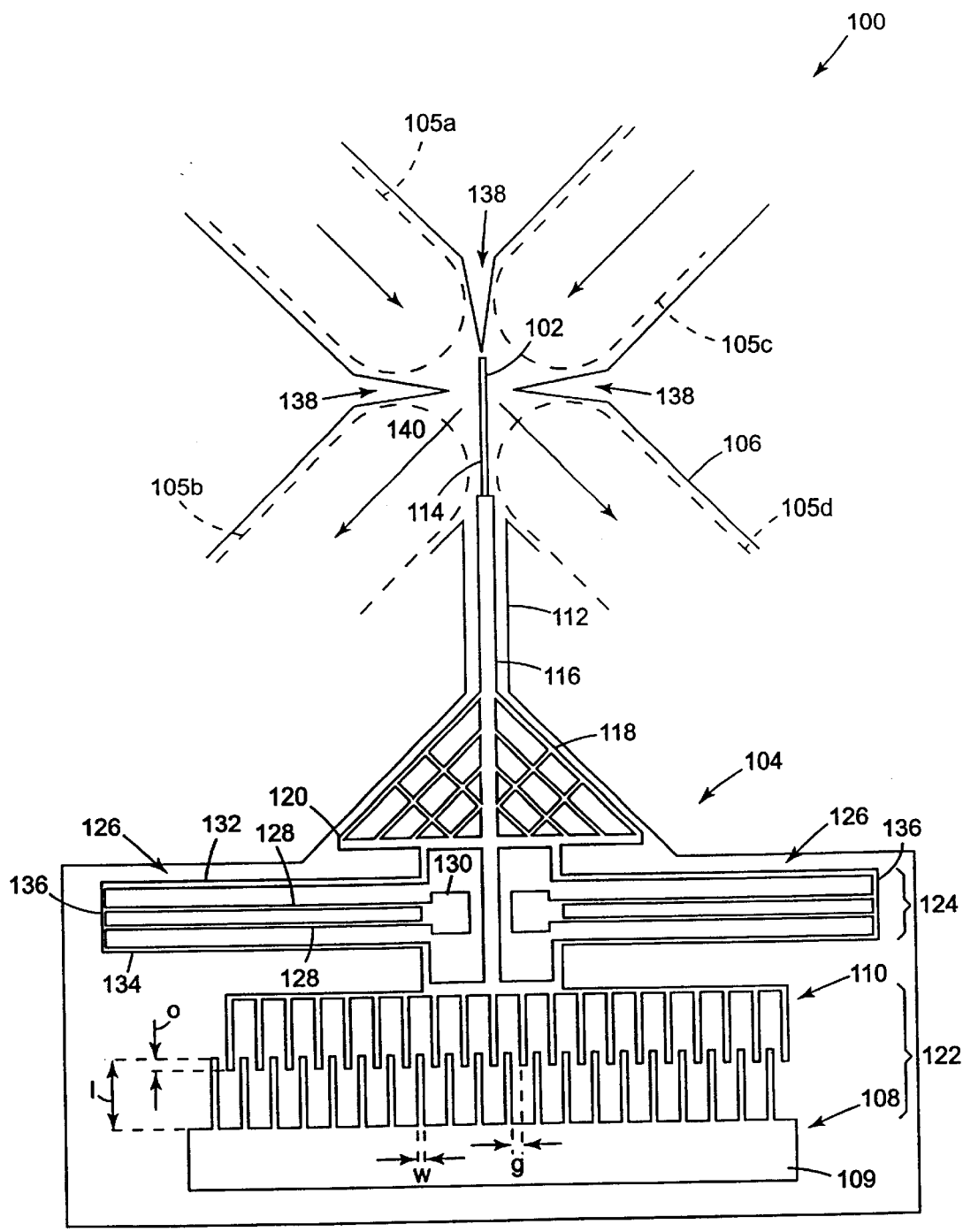
FIGS. 1 and 2 illustrate top views of an exemplary optical switch, shown in an extended and a retracted position, in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention relates generally to microelectromechanical optical switches using vertical mirrors. The invention is particularly suited to MEMS-based optical switches relying on vertical components, such as mirrors and comb fingers. While the present invention is not so limited, an appreciation of various aspects of the invention will be gained through an understanding of the examples provided below.

Figure 2:
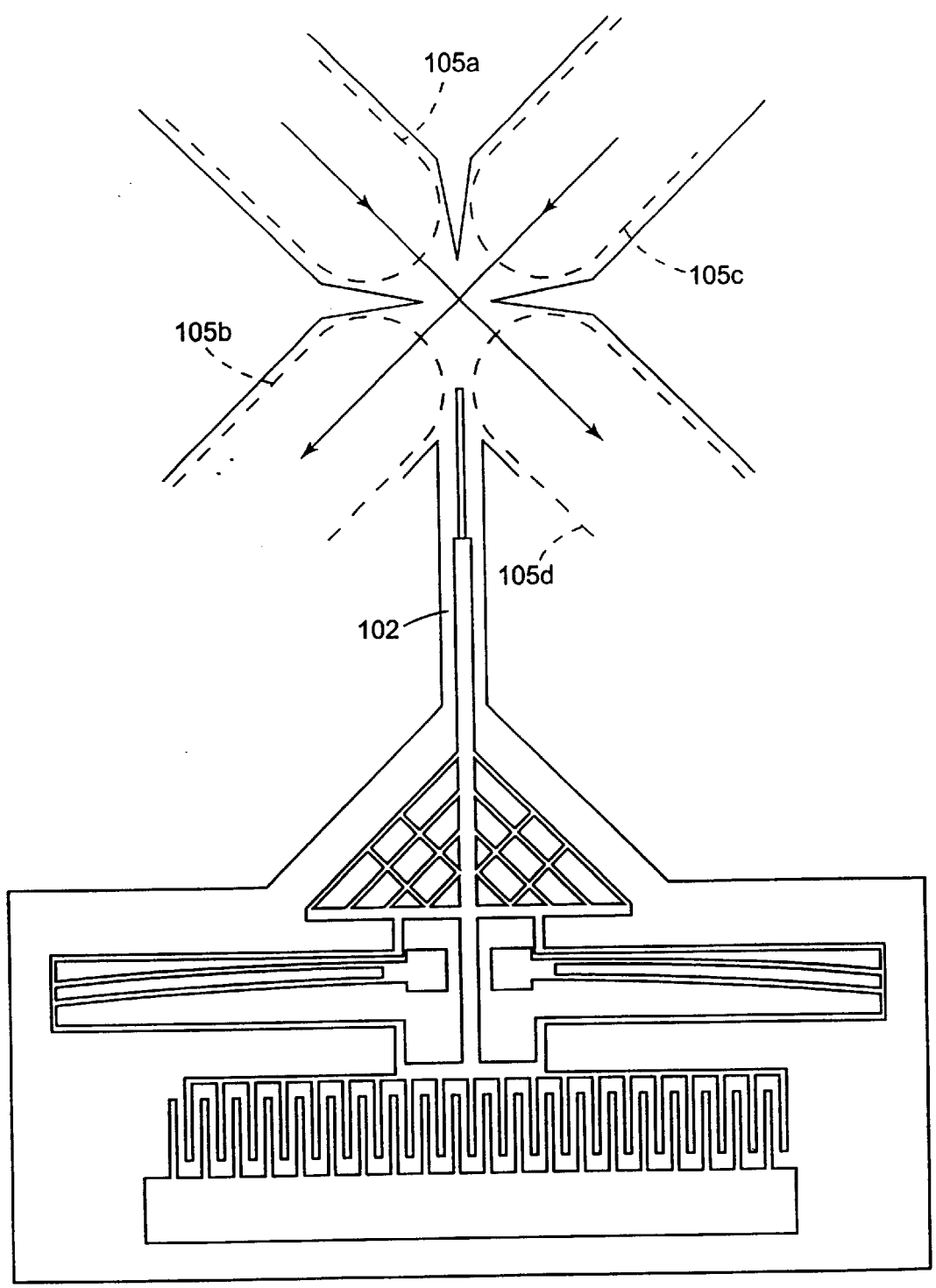

FIG. 1 illustrates a top view of an exemplary optical switch in accordance with an embodiment of the invention. As will be discussed further below, all of the features of the optical switch 100 generally reside in an upper layer of a substrate. For ease of illustration, the optical switch 100 is not shown to scale. The optical switch 100 generally includes a mirror 102 coupled to an actuator 104 capable of moving the mirror 102 between an extended position (e.g., FIG. 1) interposed between optical waveguides 105 (shown dashed) and a retracted position (e.g., FIG. 2) apart from the waveguides. In the example embodiment, when the mirror 102 lies in the extended position, lightwaves reflect off the mirror 102 to couple between waveguides 105a and 105b and 105c and 105d without transmitting between opposing waveguides 105a, 105d and 105b, 105c. When the mirror 102 lies in the retracted position, switching occurs such that lightwaves couple between waveguides 105a and 105d and waveguides 105b and 105c without reflecting off the mirror 102. As used herein, the term waveguide is intended to cover any medium which transmits light, including, e.g., optical fibers.

The mirror 102 is typically disposed in a trench 112. The trench 112 typically has a width sufficient to prevent the mirror 102 from contacting sidewalls of the trench 112 during operation. Typical, trench widths (from sidewall to sidewall) range from 40 to 50 microns for many applications. The mirror 102 typically includes a narrow wall 114 having a reflective coating on each side, mounted on an elongated base support 116 which couples the narrow wall 114 to the actuator 104. The mirror wall 114 may have a thickness or width of about 2–5 microns for many applications. This leaves an opening between the narrow wall sides and the trench sidewalls of about 20 to 25 microns in many cases. The elongated base support 116 typically is wider than the wall 114 in order to provide stability to the mirror 102 during operation. In this embodiment, the optical switch 100 further includes a support structure 118 mounted between the base support 116 for the mirror 102 and a base surface 120 of the actuator 104. In the example embodiment, the support structure 118 is a lattice work structure having lines which run at angles relative to the base surface 120 and the base support 116 for the mirror 102. The support structure 118 advantageously provides additional stability to the mirror 102 as it switches between its extended and retracted positions.

The mirror wall 114 typically includes relatively smooth and vertical sidewalls as compared to conventionally-formed vertical mirrors. For example, the sidewalls of the mirror wall 114 typically have a surface roughness 30 nm rms or less and a verticality of 90°±0.6° or better (e.g., 90°±0.5°, 90°±0.4°, 90°±0.30° or better). Techniques for forming sidewalls with such characteristics will be discussed in further detail below. As should be appreciated, the increased verticality and decreased surface roughness of the mirror wall 114 enhances the transmission characteristics of the optical switch 100 as compared to conventional optical switches.

The illustrated actuator 104 includes a drive mechanism 122 capable of applying a force which moves the mirror 102 to the retracted position and a beam structure 124 which deflects during the application of force and which returns the mirror to the extended position in the absence of the application of force by the drive mechanism 122. The beam structure 124 typically acts as a spring, deflecting in the presence of force between the combs and returning to an original position in the absence of force. In the illustrated embodiment, the beam structure 124 stores zero energy when the mirror lies in the extended position. In the example embodiment, the drive mechanism 122 is a single comb drive, which includes a stationary comb 108 interleaved with a movable comb 110 for providing the force driving the actuator 104 and thus the mirror 102 between its extended and retracted positions. The longitudinal displacement of the mirror 102 between its extended and retracted positions typically ranges from 40 to 70 microns or more and, in the illustrated embodiment, is about 55 microns.

Each of the comb fingers typically has a width w ranging from 2 to 4 microns and, in the exemplary embodiment, has a width w of about 3 microns. The two combs 108 and 110 are also tightly spaced. For example, the gap g between adjacent comb fingers typically ranges from 2 to 4 microns and, in the exemplary embodiment, is about 3 microns. In the illustrated embodiment, the individual fingers each have relatively vertical (e.g., verticality of at least 90°±0.6°) and smooth (surface roughness of 30 nm rms or less) sidewalls. The smoothness of the fingers allows for tightly-packed formation of the interleaved combs. This enables the size of the structure to be scaled down for a given applied force. Accordingly, this allows smaller switches to be developed while maintaining or reducing switching speeds. The length l of each finger, the overlap o in the absence of force (shown in FIG. 1) between the two combs 108 and 110, and the number of fingers on each comb 108, 110 is typically selected in consideration of the desired force developed between the two combs 108 and 110 as well as the desired travel distance of the mirror 102 between its extended and retracted positions. In the example embodiment, the fingers have a length l ranging from 90 to 110 microns and the combs have an overlap o of 20 to 30 microns. The number of fingers on each comb 108, 110 can vary and may range from 120 to 160 for many applications.

The illustrated beam structure 124 includes a double folded beam 126 on each side of the actuator 104. As the double folded beams 126 in the exemplary embodiment are symmetrical, only one will be described in the discussion which follows. The double folded beam 126 includes inner beams 128 attached at a first end to a fixed substrate structure 130 and first and second outer beams 132 and 134. The first outer beam 132 couples at one end with ends of the other beams and at the other end with the actuator base surface 120. The second outer beam 134 couples at one end to the other beams and at the other end to the movable comb 108. Beneath the fixed substrate structure 130, the buried insulating layer remains, fixing this structure to the substrate. The beams 132 and 134 and end piece 136 are free from the insulating, allowing the features to move with the moveable comb. During operation, the folded beams 126 acts as a spring, deflecting when the mirror 102 is moved to its retracted position and returning the mirror 102 to an extended position in the absence of force between the combs 108,110. While not shown to scale, the length of each beam 126 (measured from an axis aligned with the mirror 102 to the outer ends of the beams) may range from 700 to 1000 microns for many applications.

Advantageously, one or more features of the beam structure 124 (e.g., inner beams 128, outer beams 132 and 134, and/or end piece 136) have relatively vertical sidewalls and smooth surfaces. For example, verticality of the sidewalls may be 90°±0.6° or better with surface roughness of 30 nm rms or less. Techniques for forming relatively vertical and smooth sidewalls of the beam will be discussed below. By increasing the verticality and decreasing the roughness of the sidewalls, the strength of the beam structure 124 can be increased as compared to conventional beam structures. This enables, for example, the lifetime of the beam structure to be increased, the deflection distance of the beams to be increased, and/or the size of the structure to be reduced. In the illustrated, embodiment, the improved features of the beams allows the formation of a relatively compact optical switch having of a single comb drive actuator, relative large mirror displacement, and short switching speeds.

While the illustrated single comb drive actuator provides advantages, it should be noted that the illustrated actuator is provided by way of example and not of limitation. Other actuator types may be used with embodiments of the invention. For instance, actuators having dual comb drives may be used. Actuators having single comb drives in the opposite configuration may also be used. For example, a single comb drive actuator may be constructed such that the comb drive applies a force to extend the mirror and the beam structure returns the mirror to a retracted position. The beam structure may also vary between embodiments and is not limited to the illustrated dual beam structure. For example, other types of structures, such as different dual beam structures, or single beam structures may be utilized.

Figure 8:
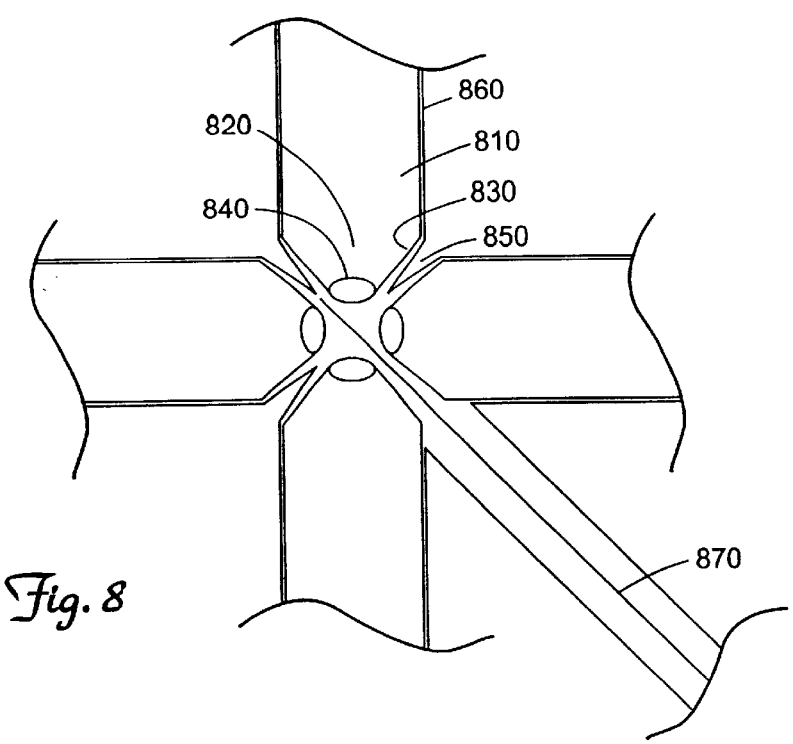
FIG. 8 is a top view of example waveguides in accordance with an embodiment of the invention.

FIG. 8 illustrates a top view of example waveguides and waveguide channel arrangement according to one particular embodiment of the invention. This example makes reference to optical fiber waveguides, though the example and the invention is not so limited.

In the example embodiment, the optical fibers 810 each include an end 820 with a sidewall 830 which tapers to a beaded lens 840. The tapered sidewall 830 may advantageously align with one or more flanges 850 of the channels 860 in order to facilitate alignment of the fibers 810 within the channels 860. The tapered sidewalls 830 can further allow the lens 840 on the end 820 of each fiber 810 to lie closer to the mirror 870. With the tapered sidewalls 830 and beaded lens 840, the distance from the each lens 840 to the mirror 870 can range from 10–30 microns and is about 20 in the example embodiment. The beaded lens 840 can also focus transmitted light waves. As a result of the focused light and close proximity to the mirror 870, light transmission loss can be decreased dramatically.

One exemplary method of forming a tapered fiber with a beaded lens includes heating a fibers to melting temperature, drawing the fiber into a taper and then splicing the drawn fiber to form tapered ends. After splicing, the tapered ends may be heated to bead the ends and form a focusing lens. The beaded ends may further be polished.

Turning back to FIGS. 1 and 2, in operation, a voltage differential is applied between the two combs 108 and 110 thus creating a force which attracts the two combs 108 and 110 to one another and retracts the mirror 102 from its extended position between the fibers to its retracted position apart from the fibers. The tightly-packed and smooth comb fingers can apply a force which switches the mirror between its extended and retracted position in 0.2 to 1 milliseconds. Advantageously, features of the actuator enable the mirror to be displaced a relatively long distance with little deflection in a transverse direction. For example, the lattice support structure and the folded beam structure both serve to reduce transverse deflection and resonation of the mirror. This serves to further increase the optical transmission characteristics of the switch.

With reference to FIGS. 3A–3F and 4, an exemplary process for fabricating an optical switch such as the optical switch discussed above, will be described. For ease of illustration, the cross section depicted in FIGS. 3A–3E corresponds to a cross section of the substrate used to form a vertical mirror wall, such as the narrow wall 114 discussed above.

In this example process, a masking layer 303 is formed over a substrate 301. The substrate 301 is typically formed from a semiconductor material, such as silicon, and includes a buried insulating layer 302 separating the substrate 301 into an upper portion 304 and a lower portion 306. The buried insulating layer 302 may, for example, be an oxide layer, such as silicon dioxide. The depth of the upper substrate 304 may, for example, be about 75 microns. The optical switch structures will be formed in the upper portion 304 of the substrate 301 above the insulating layer 302.

Figure 3A:
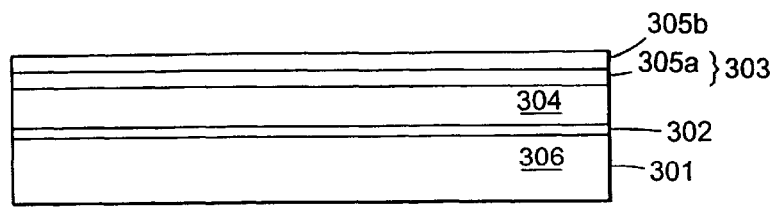
FIGS. 3A–3F illustrate an exemplary process in accordance with an embodiment of the invention.

The masking layer 303 is provided to protect portions of the substrate during subsequent substrate etching and typically has a thickness sufficient to do so. In the illustrated process, the masking layer 303 is formed from a double layer of the same photoresist material. The photoresist material may, for example, be S1818. While a double photoresist layer can be advantageous, the masking layer 303 may be formed from any suitable masking material, including oxide and photoresist, using known techniques. The resultant structure is shown in FIG. 3A.

The double photoresist layer 303 typically includes a first photoresist layer 305a formed over the substrate 301 and a second photoresist layer 305b, formed from the same material as the first photoresist layer 305a, formed over the first photoresist layer 305a. Each layer 305a, b is typically formed to its maximum rated thickness. The maximum rated thickness of a particular photoresist is typically provided by a photoresist manufacturer and corresponds to the maximum thickness of the photoresist material which provides a specified degree of surface planarity. For S1818, this thickness is about 2 microns.

Typically, the first layer 305a of photoresist material is deposited and heated prior to the deposition and heating of the second layer 305b of photoresist material. The use of a double layer of S1818 allows fine patterning of a relatively thick photoresist layer. This, in turn, allows deep etching of the underlying substrate to form fine features in the substrate. S1818 photoresist may also be removed in an advantageous manner. Further details and advantages of double photoresist layer formation can be found in application Ser. No. 09/372,428 entitled "Method of Etching a Wafer Layer Using Multiple Layers of the Same Photoresistant Material and Structure Formed Thereby," filed concurrently herewith, the contents of which are herein incorporated by reference.

Figure 3B:
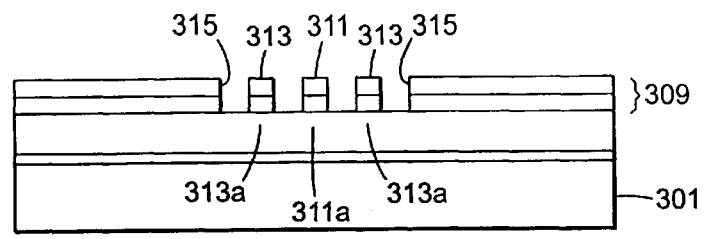

Portions of the double photoresist layer 303 are removed to form a patterned photoresist layer 309, as illustrated in FIG. 3B. Removal of the portions of the photoresist layer 303 may be done using photolithography techniques. In particular, when using S1818 photoresist, for example, photoresist layer portions may be removed using acetone without the assistance of ultrasound. Exposed portions of the substrate 301 will be removed in subsequent fabrication. The patterned masking layer 309 generally covers portions of the substrate 301 which will remain after substrate removal. The remaining portions of the substrate 301 typically form the features of the resultant optical switch (e.g., mirror wall, trench sidewalls, waveguide channels, actuator combs and beams, etc.).

As noted above, the cross-section illustrated in FIGS. 3A–3E shows the formation of a mirror wall. In this case, the patterned masking layer 309 includes a portion 311 covering a first region 311a of the substrate 301 and two side portions 313 covering side regions 313a of the substrate adjacent each side of the first region 311. Sidewalls 315 of the photoresist layer 309 are used to define edges of a trench in which the mirror is formed. The mask portion 311 is provided to form a mirror wall in the first region 311a. The side mask structures 313 cover regions 313a in which sacrificial walls are formed.

The mask structures 313 serve to limit the exposed portion of the substrate during etching and increase the verticality of the walls of the mirror structure of region 311a. The distance or gap between the mask portion 311 and each side mask portion 313 is selected to optimize the verticality of the resultant mirror structure in region 311a. Gap distances of 10–30 microns are suitable for many applications. A gap distance of 20 microns works particularly well with the removal process discussed below. A more detailed discussion of the advantages of such sacrificial walls can be found in application Ser. No. 09/788,821 entitled "Method of Etching a Wafer Layer Using a Sacrificial Wall and Structure Formed Thereby," filed concurrently herewith, the contents of which are herein incorporated by reference.

Figure 4:
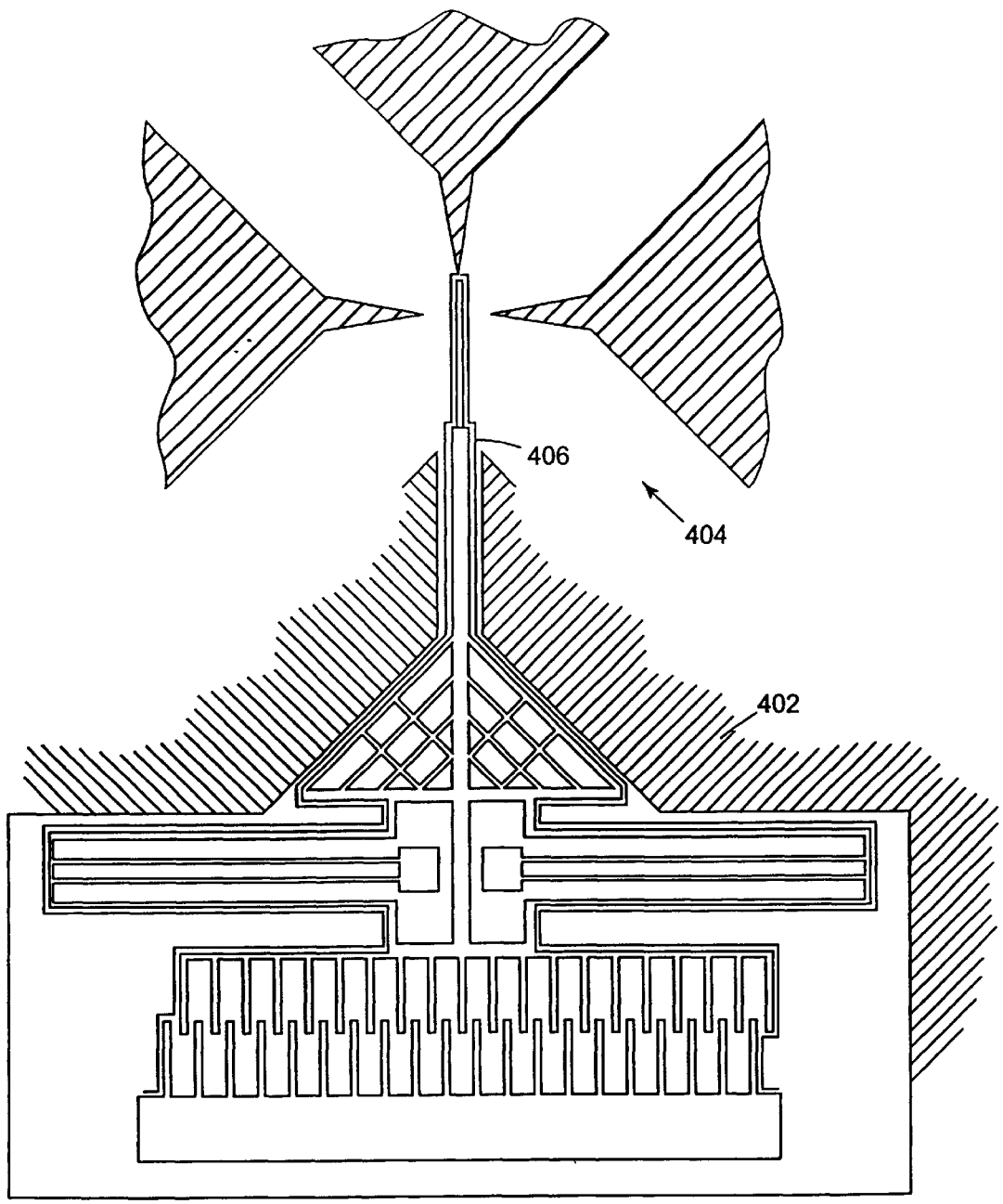
FIG. 4 illustrates an exemplary top view of an optical switch during fabrication in accordance with another embodiment of the invention.

By way of example, FIG. 4 illustrates a top view of an optical switch after patterning of a masking layer. The shaded area represents a patterned masking layer 402 and the open areas indicate exposed portions of an underlying substrate 404. The patterned masking layer 402 includes a mask portion 406 which is provided to form a sacrificial wall around optical switch features, such as the mirror wall and outer beams, for example. Substrate regions under mask portion 406 will be removed after etching open areas of substrate 404 as discussed below. The use of a sacrificial wall mask 406 facilitates vertical etching of the adjacent structures, such as the mirror wall and the beams, as noted below.

Figure 3C:
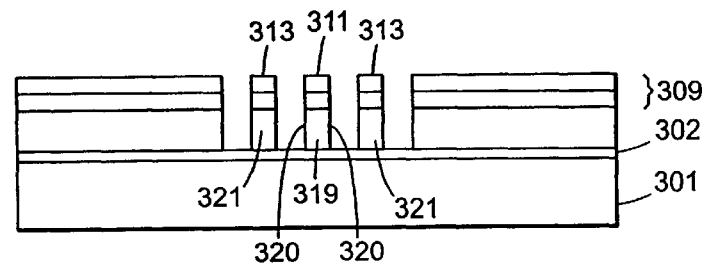

With the patterned masking layer 309 in place, exposed portions of the substrate 301 are removed, as illustrated in FIG. 3C. This removal process may be performed using deep reactive ion etching (DRIE). In one embodiment, a standard BOSCH DRIE process is used. This process is typically a 3-step process carried out under the following conditions:

Pressure: 15 m Torr

He Flow: 7.45 sccm (standard cubic centimeters per minute)

In step 1, $C_4F_8$ 200 (70 sccm), $SF_6$ 200 (0.5 sccm) and Argon (40 sccm) are flowed for 4 seconds. In step 2, $C_4F_8$ 200 (0.5 sccm), $SF_6$ 200 (50 sccm) and Argon (40 sccm) are flowed for 3 seconds. In the step 3, $C_4F_8$ 200 (0.5 sccm), $SF_6$ 200 (100 sccm) and Argon (40 sccm) are flowed for 5 seconds. In an alternate embodiment, the flow time for the first and second steps are increased (to, e.g., 5 seconds and 4 seconds, respectively) and the flow time for the third step is decreased (to, e.g., 3 seconds). This alternative embodiment advantageously provides more vertical sidewalls than the standard BOSCH DRIE process.

The removal process typically uses an etchant selective to the buried insulating layer 302 thereby stopping the etching process on this layer. As a result of the sidewall structures 321, and masks 313, the raised structure 319 under mask 311 is formed with relatively vertical sidewalls 320. In the illustrated embodiment, the sidewalls 320 typically have a verticality (relative to the horizontal plane of the substrate) of $90°\pm0.6°$ or better (e.g., $90°\pm0.5°$, $90°\pm0.4°$, $90°\pm0.3°$ or better). This procedure also leaves the raised feature 319 with relatively smooth sidewalls. For example, using this process, surface roughness of the sidewalls may be 30 nm rms or less.

Figure 3D:
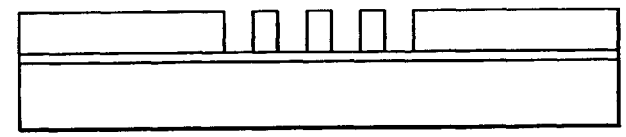

The photoresist is removed, as illustrated in FIG. 3D. This may be done using acetone, as noted above. By using acetone without the assistance of ultrasound, the photoresist may be removed without damaging the fragile structures, such as the actuator combs, mirror, and folded beams. The use of acetone in this manner can, for example, also more effectively remove debris from the substrate. Following the photoresist removal, portions of the buried insulating layer 302 are removed. The insulating layer 302 is typically removed using a buffered insulating etch (e.g., a 10 to 1 solution of hydrochloric acid to water). During this process, the etchant removes exposed portions of the insulating layer 302 as well as portions of the insulating layer 302 beneath the silicon structures formed above the insulating layer 302. It should be appreciated, beneath relatively narrow silicon structures (e.g., mirror wall, actuator beams, comb fingers, etc.) the underlying insulating layer 302 is sufficiently removed to separate these structures from the substrate 301. Under thicker features (e.g., fixed supports 130 for the beams, the base portion 109 of the stationary comb 110) the insulating layer 302 remains intact, thereby fixing these features to the substrate 301. This enables structures, such as the mirror, the beams, and movable comb, to move.

Figure 3E:
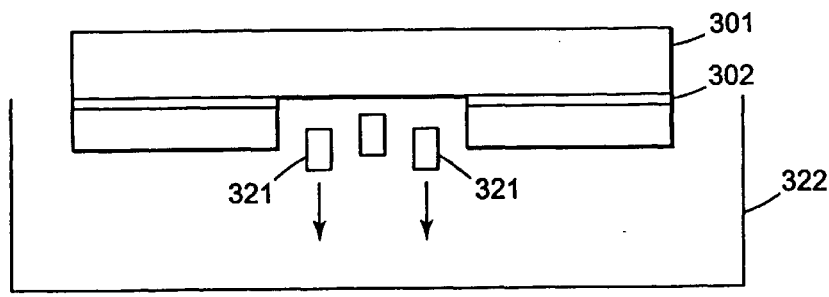
Figure 3F:
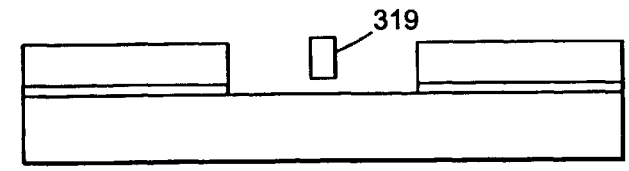

The removal process is typically performed by dipping the substrate 301 in an etchant 322, as shown in FIG. 3E. During this process, the insulating layer 302 beneath the sacrificial walls 321 is removed and the sacrificial walls 321 fall into the etching solution 322. This leaves the first raised feature 319 (mirror wall) supported by the substrate/insulating layer underlying other portion of the switch, (e.g., fixed beam supports 130). The mirror wall 319 is formed between two sidewalls of a trench 323. The resultant structure is shown in FIG. 3F.

The use of a double photoresist layer of the same material in combination with the formation with sacrificial sidewall masks enables the formation of a relatively deep, thin and vertical structures with smooth surfaces. These structures may be used as a mirror, the comb fingers of the actuator and/or the beams of the beam structure, for example. Using these techniques, verticality of the raised features may be a least $90°\pm0.6°$ with a surface roughness of 30 nm rms or less.

It should be appreciated, during later processing the mirror wall is typically coated with a reflective metal to form a reflective surface. As a result the improved verticality and decreased surface roughness of the mirror wall, the reflective surface has an increased verticality and decreased roughness. This reduces scattering and improves the optical characteristics of the switch. During the later processing, metal is also typically deposited on the two combs to provide electrodes for the combs. These metal depositions may be carried out using, for example, known techniques. The wafer is typically boron-doped prior to processing to provide conductivity to the substrate and allow a voltage difference to be applied between the combs.

Figure 5:
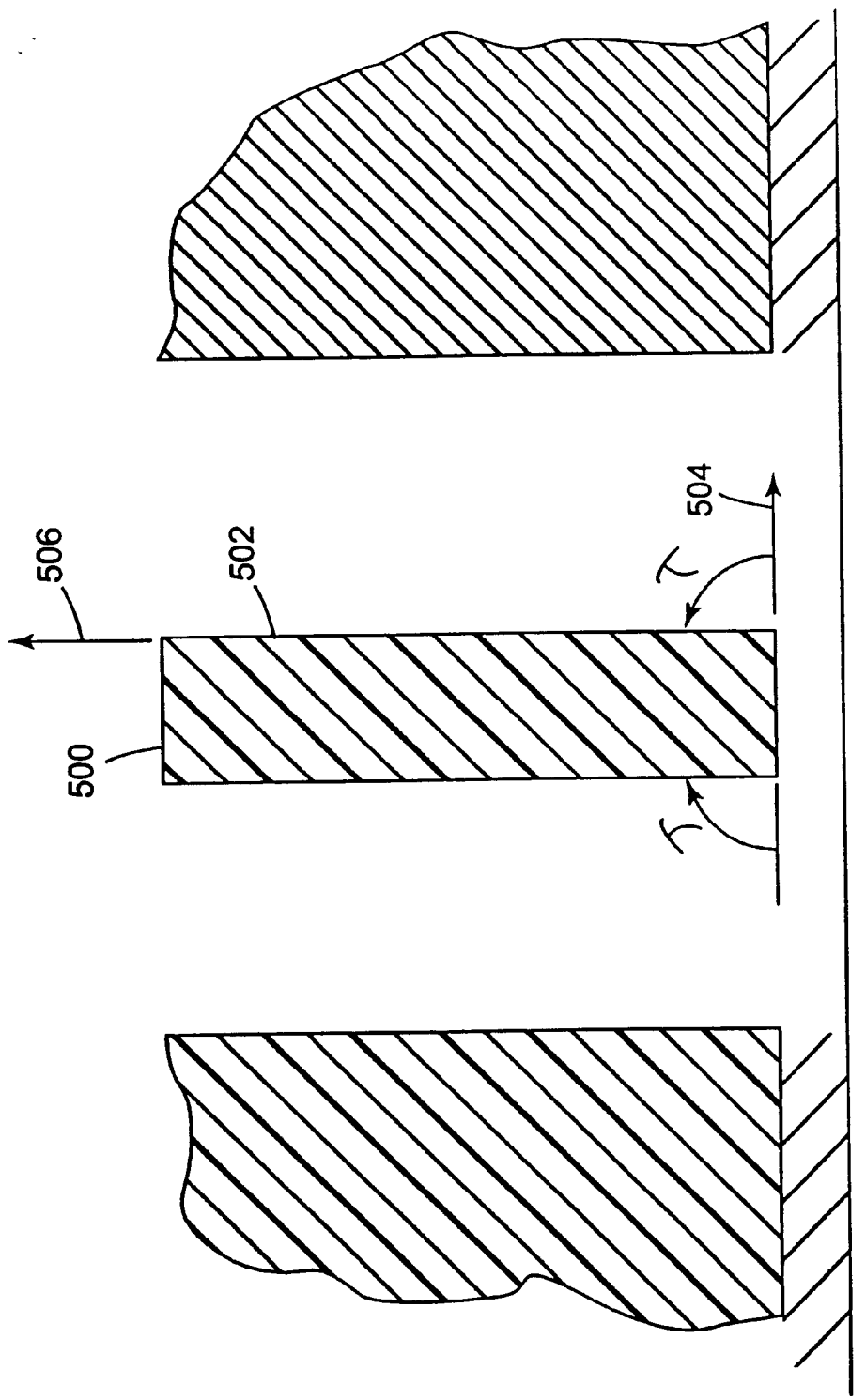
FIG. 5 illustrates a cross-section of an exemplary mirror in accordance with yet another embodiment of the invention.

FIG. 5 illustrates an exemplary vertical structure formed in accordance with the above process. The cross section may represent the cross section of a vertical feature, such as a mirror or beam of the beam structure. The vertical structure 500 has sidewalls 502 with a verticality (represented by the angle $\lambda$ between a horizontal plane 504 of the substrate and the plane 506 of the sidewall 502) of 90°±0.6° or better and surface roughness of 30 nanometers rms or less.

Figure 6:
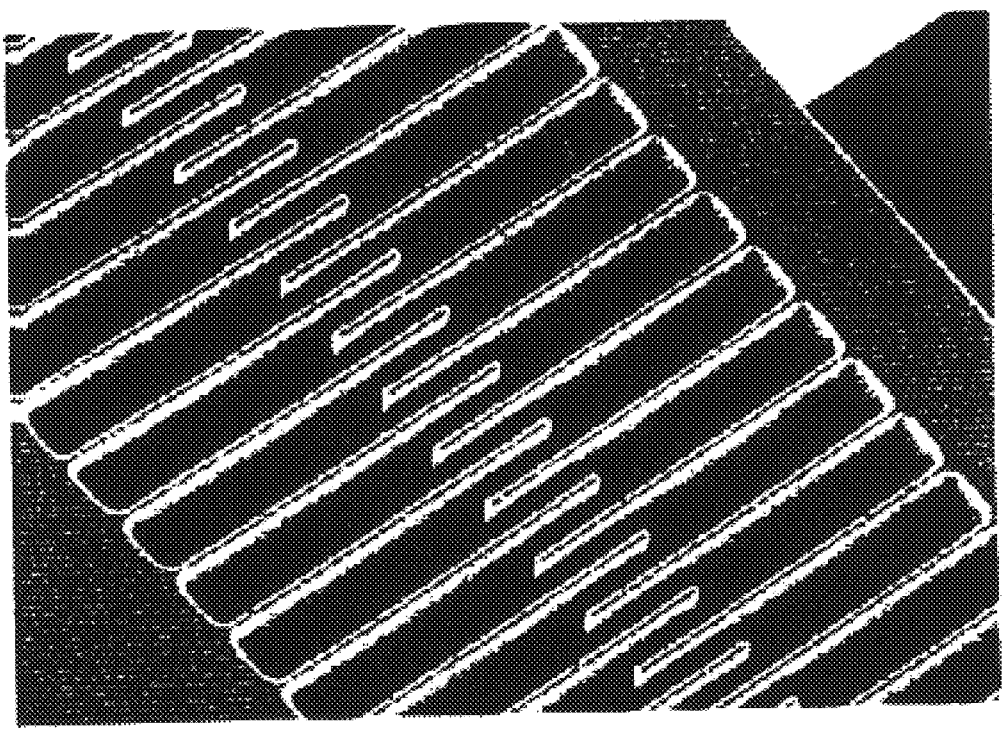
FIG. 6 is a perspective view of actuator combs formed in accordance with an embodiment of the invention.
Figure 7:
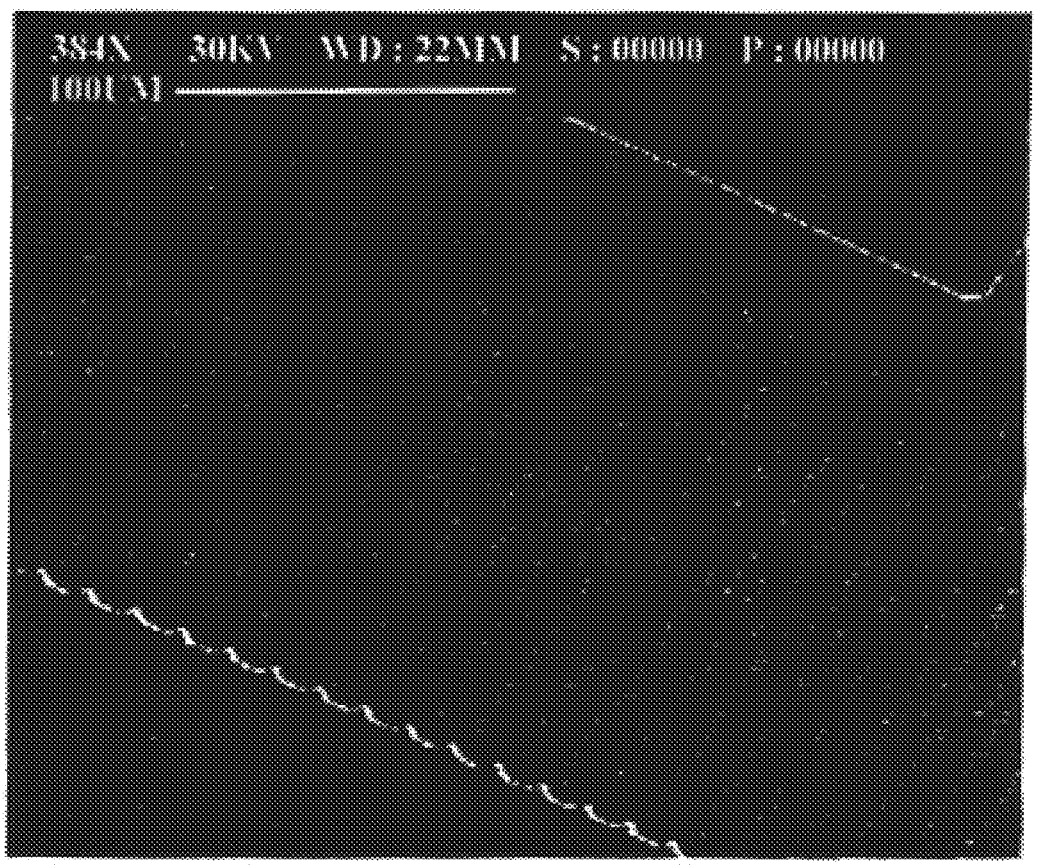
FIG. 7 is a perspective view of actuator combs formed using an oxide mask.

FIGS. 6 and 7 illustrate combs for an actuator formed using two different techniques. FIG. 6 illustrates combs formed using a double photoresist layer of S1818 and a removal process relying on acetone rather than ultrasound as discussed above. FIG. 7, in contrast, illustrates the formation of similar features using a patterned masking layer formed from an oxide. As can be seen, the comb fingers formed using the present process have decreased surface roughness and more defined features. The comb fingers of FIG. 6 also are associated with less debris between the fingers. As debris can short the combs of the actuator and degrade device performance, this further increases product yield and device performance.

Figure 9:
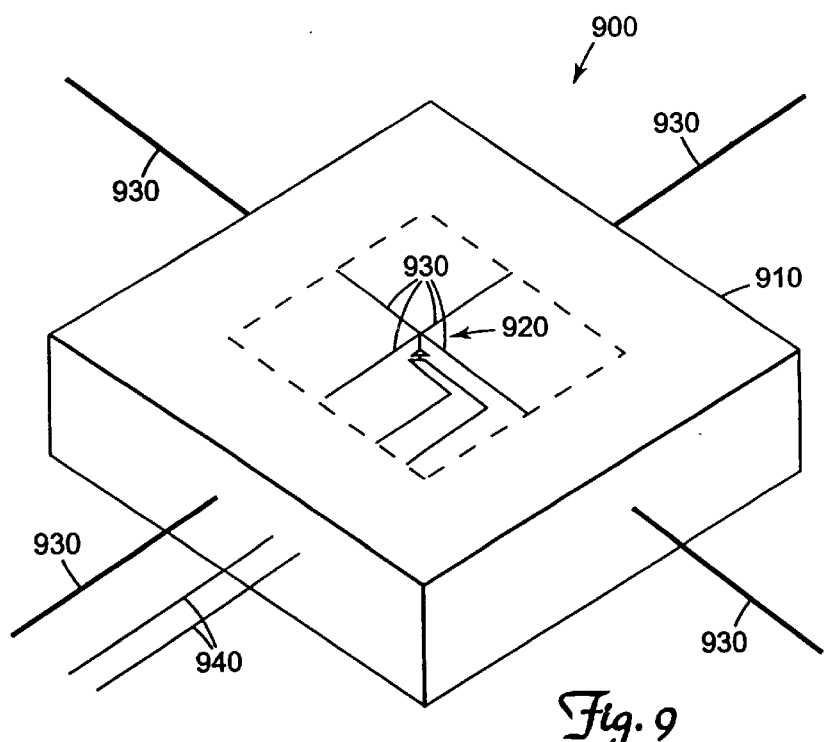
FIG. 9 is a perspective view of an exemplary switch package with a cut away portion in accordance with an embodiment of the invention.

FIG. 9 illustrates a switch package which includes a MEMS optical switch in accordance to a further embodiment of the invention. The example package 900 includes a housing 910 containing a 2×2 optical switch 920. The switch 920 may, for example, be similar to the switch illustrated in FIGS. 1 and 2 above. Four optical fibers 930 extend from the switch 920 and outward from the housing 910. The fibers 930 may, for example, interconnect the switch 930 with other network components. While not shown, the fibers 930 typically run in channels formed in a substrate body. Conductive leads 940 extend from the combs of the switch 930, typically to a power supply. It is noted that the package is provided by way of example and not of limitation. Many types of switch packages fall within the scope of the invention. For example, switch packages may be provided which include external control circuitry (i.e., outside of the housing) or internal control circuitry (e.g., within the housing and, in some cases, on the same substrate as the switch). Moreover, while the exemplary package depicts a 2×2 switch, the invention is not so limited. Many different types of switch packages, such as 4×4, 8×8, 16×16 matrix switches, for example, may be formed by, for example, cascading switches. Also, 1×N switches may be implemented with the optical switches noted above.

As noted above, the present invention is applicable to the fabrication of a number of different optical switches. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A method of forming a mirror on a substrate, comprising:
    forming, over the substrate, a patterned masking layer covering a first region of the substrate and two side regions of the substrate each adjacent a side of the first region;
    removing uncovered portions of the substrate using the patterned masking layer to leave a first raised structure in the first substrate region and two sacrificial raised structures on each side substrate region adjacent the first raised structure;
    selectively removing the sacrificial raised structures while leaving the first raised structure intact; and
    adding a reflective material to a sidewall of the first raised structure to form a reflective surface of increased reflectance.

2. The method of claim 1, wherein forming the patterned masking layer includes forming an opening, between the first region and the each side region, having a width of about 10 to 30 microns.

3. The method of claim 2, wherein removing uncovered portions of the substrate to leave the first raised structure includes forming a gap having a width of about 10 to 30 microns between the first raised structure and each of the sacrificial raised structures.

4. The method of claim 3, wherein removing uncovered portions of the substrate includes forming the first raised structure with a surface roughness of 30 nm rms or less.

5. The method of claim 4, wherein removing uncovered portions of the substrate includes leaving the sidewall of the first raised structure with a verticality of at least 90°±0.6°.

6. The method of claim 5, wherein removing uncovered portions of the substrate includes forming a trench having a depth of 75 microns or more between the first raised structure and each of the sacrificial raised structures.

7. The method of claim 1, wherein forming the patterned masking layer includes depositing multiple layers of the same photoresist material over the substrate and heating each deposited layer prior to the deposition of a subsequent layer.

8. The method of claim 1, wherein forming the patterned masking layer includes forming openings in the patterned masking layer exposing substrate regions surrounding each of the two side regions.

9. The method of claim 8, wherein the substrate includes an insulating layer embedded in the substrate with respect to an outer surface of the substrate, wherein removing uncovered portions of the substrate includes removing the exposed substrate regions surrounding the two side regions to leave the sacrificial raised structures on the insulating layer isolated from the first raised structure and selectively removing the sacrificial raised structures includes removing the insulating layer from beneath the sacrificial raised structures, thereby freeing the sacrificial raised structures from the substrate.

10. The method of claim 9, wherein selectively removing the sacrificial raised structures includes leaving the first raised structure within a trench defined by the substrate.

11. A method of forming an optical switch on a substrate having a buried insulating layer, comprising:
    forming, over the substrate, a composite photoresist layer including multiple layers of the same photoresist material;
    removing portions of the photoresist layer using acetone to form a patterned photoresist layer selectively masking regions of the substrate in which a mirror wall, actuator combs, actuator beams and sacrificial walls will be formed;

etching exposed portions of the substrate to the insulating layer using the patterned masking layer to leave the mirror wall, actuator combs, actuator beams and sacrificial walls, the sacrificial walls being disposed at least along first and second sidewalls of the mirror wall;

removing portions of the insulating layer beneath the mirror wall, actuator beams, movable comb, and sacrificial walls to free the mirror wall, actuator beams, movable comb, and sacrificial walls from the substrate;

removing the sacrificial walls to leave the mirror wall disposed in a trench; and forming a reflective surface on the sidewalls of the mirror wall.

* * * * *